United States Patent
Kim et al.

(10) Patent No.: US 10,381,074 B1
(45) Date of Patent: Aug. 13, 2019

(54) DIFFERENTIAL WEIGHT READING OF AN ANALOG MEMORY ELEMENT IN CROSSPOINT ARRAY UTILIZING CURRENT SUBTRACTION TRANSISTORS

(71) Applicant: International Business Machines Corporation, Armonk, NY (US)

(72) Inventors: Seyoung Kim, White Plains, NY (US); Soon-Cheon Seo, Glenmont, NY (US); Injo Ok, Loudonville, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/949,564

(22) Filed: Apr. 10, 2018

(51) Int. Cl.
| | |
|---|---|
| *G11C 27/00* | (2006.01) |
| *G11C 13/00* | (2006.01) |
| *G11C 11/56* | (2006.01) |
| *G06F 17/16* | (2006.01) |
| *G06N 3/08* | (2006.01) |

(52) U.S. Cl.
CPC ............ *G11C 13/004* (2013.01); *G06F 17/16* (2013.01); *G06N 3/08* (2013.01); *G11C 11/56* (2013.01); *G11C 27/00* (2013.01); *G11C 2013/0042* (2013.01)

(58) Field of Classification Search
CPC .................................................... G11C 27/00
USPC ........................................................ 365/46
See application file for complete search history.

(56) References Cited

U.S. PATENT DOCUMENTS

| | | |
|---|---|---|
| 6,256,247 B1 | 7/2001 | Perner |
| 6,476,662 B2 | 11/2002 | Geysen |
| 6,836,443 B2 | 12/2004 | Dadashev |
| 7,372,753 B1 | 5/2008 | Rinerson et al. |
| 7,978,501 B2 | 7/2011 | Chevallier et al. |
| 9,852,790 B1 | 12/2017 | Gokmen et al. |
| 2017/0109626 A1 | 4/2017 | Gokmen et al. |
| 2017/0206956 A1 | 7/2017 | Foltin et al. |

(Continued)

OTHER PUBLICATIONS

T. Gokmen et al., "Acceleration of Deep Neural Network Training with Resistive Cross-Point Devices: Design Considerations," Frontiers in Neuroscience, Jul. 21, 2016, 13 pages, vol. 10, No. 333.

(Continued)

*Primary Examiner* — Hoai V Ho
(74) *Attorney, Agent, or Firm* — Vazken Alexanian; Ryan, Mason & Lewis, LLP

(57) ABSTRACT

A resistive processing unit includes an analog memory element coupled to a read row line and a read column line, a first current subtraction field-effect transistor (FET) coupled to the read row line and the analog memory element, and a second current subtraction FET coupled to the read column line and the analog memory element. The analog memory element is configured to store a weight value as its conductance. Application of a gate pulse voltage to one of the first current subtraction FET and the second current subtraction FET during application of a read pulse voltage to one of the read row line and the read column line reduces a measured conductance of the analog memory element, and the reduction of the measured conductance of the analog memory element provides net current for the stored weight value.

20 Claims, 6 Drawing Sheets

(56) References Cited

U.S. PATENT DOCUMENTS

2018/0114572 A1* 4/2018 Gokmen ............ G11C 13/0007

OTHER PUBLICATIONS

R.A. Nawrocki et al., "A Mini Review of Neuromorphic Architectures and Implementations," IEEE Transactions on Electron Devices, Oct. 2016, pp. 3819-3829, vol. 63, No. 10.

* cited by examiner

100

FORWARD PASS $y = W \times x$

200

BACKWARD PASS $z = W^T \times \delta$

300

WEIGHT UPDATE $w_{ij} \leftarrow w_{ij} + \eta \, x_i \times \delta_j$

400

500

600

900

DIFFERENTIAL WEIGHT READING OF AN ANALOG MEMORY ELEMENT IN CROSSPOINT ARRAY UTILIZING CURRENT SUBTRACTION TRANSISTORS

BACKGROUND

The present application relates to semiconductors, and more specifically, to techniques for forming resistive memory element semiconductor structures. Arrays of trainable resistive crosspoint devices, referred to herein as resistive processing units (RPUs), may be used to perform vector-matrix multiplication in an analog domain in a parallel fashion.

SUMMARY

Embodiments of the invention provide techniques for differential weight reading of analog memory elements utilizing current subtraction transistors.

In one embodiment, a resistive processing unit comprises an analog memory element coupled to a read row line and a read column line, a first current subtraction field-effect transistor (FET) coupled to the read row line and the analog memory element, and a second current subtraction FET coupled to the read column line and the analog memory element. The analog memory element is configured to store a weight value as its conductance. Application of a gate pulse voltage to one of the first current subtraction FET and the second current subtraction FET during application of a read pulse voltage to one of the read row line and the read column line reduces a measured conductance of the analog memory element, and the reduction of the measured conductance of the analog memory element provides net current for the stored weight value.

In another embodiment, an integrated circuit comprises a pulse generator and an array of two or more resistive processing units. A given one of the resistive processing units comprises an analog memory element coupled to a read row line and a read column line, the analog memory element configured to store a weight value as its conductance, a first current subtraction FET coupled to the read row line and the analog memory element, and a second current subtraction FET coupled to the read column line and the analog memory element. The pulse generator is configured to receive a read pulse data stream, to generate a first voltage based on the read pulse data stream, the first voltage having a read pulse width based on the read pulse data stream, to generate a second voltage, the second voltage having a gate pulse width synchronized with the read pulse width of the first voltage, to apply the first voltage to one of the read row line and the read column line, and to apply the second voltage to a gate of one of the first current subtraction FET and the second current subtraction FET. The second voltage reduces a measured conductance of the analog memory element to provide net current for the stored weight value.

In another embodiment, a method for differential weight reading of an analog memory element in a resistive processing unit comprises receiving a read pulse data stream, generating a first voltage based on the read pulse data stream, the first voltage having a read pulse width based on the read pulse data stream, generating a second voltage, the second voltage having a gate pulse width synchronized with the read pulse width of the first voltage, and applying the first voltage to one of a read row line and a read column line of the resistive processing unit. The method also includes applying the second voltage to a gate of one of: a first current subtraction FET coupled to the read row line and the analog memory element; and a second current subtraction FET coupled to the read column line and the analog memory element. The method further comprises measuring a conductance of the analog memory element, wherein the measured conductance is reduced by application of the second voltage to said one of the first current subtraction FET and the second current subtraction FET to provide net current for a stored weight value of the analog memory element.

DETAILED DESCRIPTION

Figure 1:
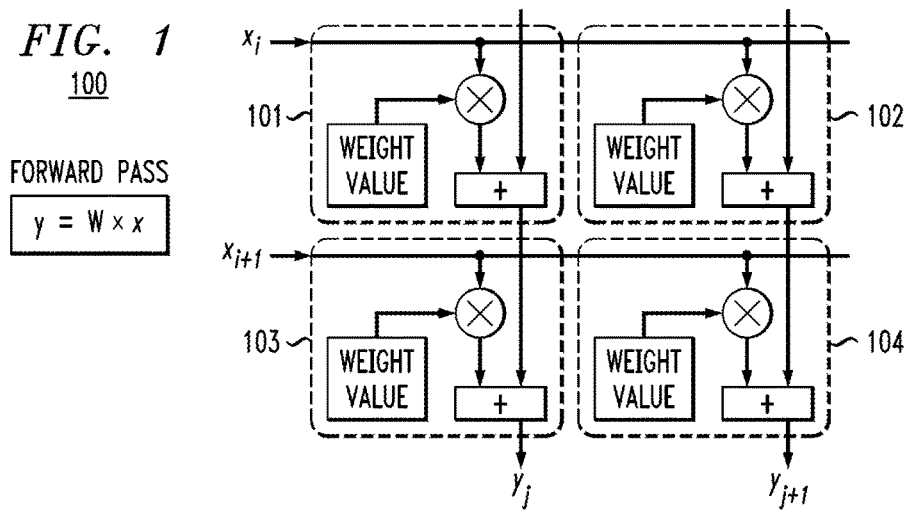
FIG. 1 depicts a circuit diagram of a forward pass in a resistive processing unit array, according to an embodiment of the present invention.

Illustrative embodiments of the invention may be described herein in the context of illustrative methods for differential weight reading of analog memory elements utilizing current subtraction transistors, along with resistive processing units and arrays comprising such analog memory elements. However, it is to be understood that embodiments of the invention are not limited to the illustrative methods, apparatus, systems and devices but instead are more broadly applicable to other suitable methods, apparatus, systems and devices.

Use of resistive processing unit (RPU) arrays to perform vector-matrix multiplication in an analog domain in a parallel fashion can lead to significant performance enhancement (e.g., 10,000×) compared to central processing unit (CPU) and graphical processing unit (GPU) counterparts. Analog weight storage elements in RPU cells may be configured to store values that do not include sign information (e.g., whether the stored value is positive or negative). Some RPU operations, however, require processing of positive, zero and negative weight values. Embodiments provide techniques for implementing current subtraction in RPU arrays to provide such functionality.

RPUs, also referred to as trainable resistive crosspoint devices, may be used for various types of operations such as those involving vector-matrix multiplication. One such exemplary use case is in artificial neural networks (ANNs) formed from crossbar arrays of two-terminal RPUs that provide local data storage and local data processing without the need for additional processing elements beyond the two-terminal RPU, thereby accelerating an ability of an ANN to learn and implement algorithms such as online neural network training, matrix inversion, matrix decomposition, etc.

Machine learning is a term used herein to broadly describe a function of electronic systems that learn from data. In machine learning and cognitive science, ANNs are a family of statistical learning models. ANNs are inspired by biological neural networks of animals (e.g., the brain). ANNs may be used to estimate or approximate various systems and functions that depend on a large number of inputs, particularly where inputs are generally unknown.

ANNs may be embodied as "neuromorphic" systems of interconnected processor elements that act as simulated neurons and exchange messages between each other in the form of electronic signals. Similar to the so-called plasticity of synaptic neurotransmitter connections that carry messages between biological neurons, connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition may be defined by a set of input neurons, which may be activated by pixels of an input image. After being weighted and transformed by a function determined by a designer of the ANN, the activations of the input neurons are passed to other downstream neurons, often referred to as hidden neurons. This process is repeated until an output neuron is activated, with the activated output neuron determining which character was read.

Crossbar arrays, also referred to as crosspoint arrays or crosswire arrays, are high density and low cost circuit architectures used to form a variety of electronic circuits and devices, including but not limited to ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material.

Crosspoint devices, in effect, function as an ANN's weighted connections between neurons. Nanoscale two-terminal devices, such as resistive memory elements or memristors having "ideal" conduction state switching characteristics, may be used as the crosspoint devices in order to emulate synaptic plasticity with high energy efficiency. The conduction state (e.g., resistance) of the ideal memristor material may be altered by controlling voltages applied between individual wires of the row and column wires. Digital data may be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device.

As mentioned above, an array of RPUs may be used to perform vector-matrix multiplication in an analog domain in a parallel fashion, leading to significant performance enhancement relative to CPU/GPU counterparts. A neural network may use backpropagation for learning, which involves a forward pass, a backward pass and a weight update. In the forward pass, the network is activated on example input, and the error for each neuron of an output layer is computed. In the backward pass, the network error is used to update the weights by propagating the error backwards from the output layer through the network layer by layer. This may be done recursively by computing a local gradient for each neuron. The local gradients are then used to perform each weight update.

Figure 2:
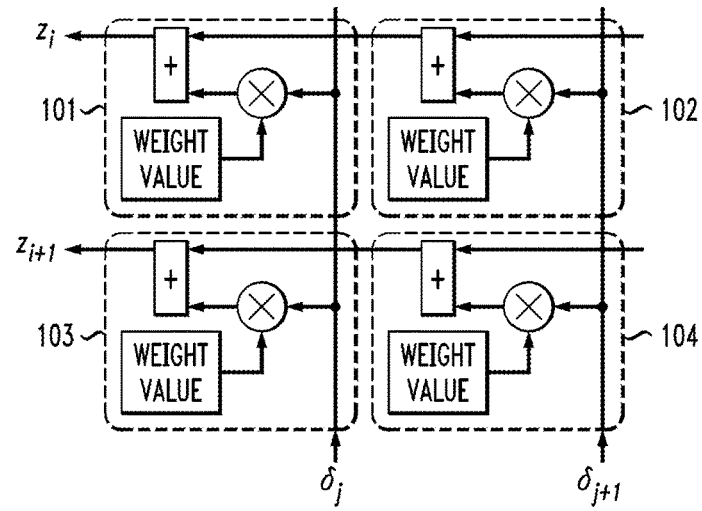
FIG. 2 depicts a circuit diagram of a backward pass in a resistive processing unit array, according to an embodiment of the invention.
Figure 3:
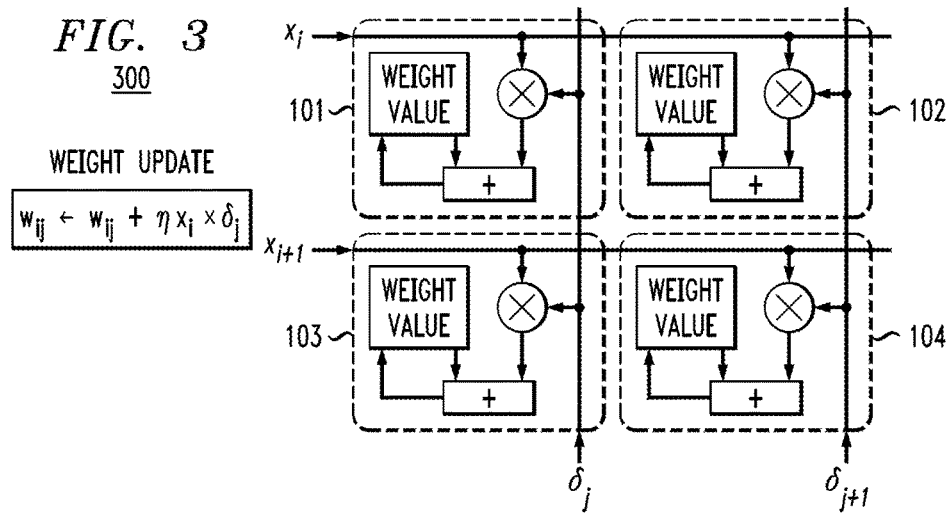
FIG. 3 depicts a circuit diagram of a weight update in a resistive processing unit array, according to an embodiment of the invention.

FIG. 1 depicts a circuit diagram 100 of a 2×2 RPU array, with each resistive memory element 101, 102, 103, 104 shown in dashed outline storing a weight value as illustrated. The FIG. 1 RPU array more particularly illustrates a forward pass, wherein input values are provided to the RPU array via voltage pulses $x_i$ and $x_{i+1}$, to encode vector numbers. Accumulated currents $y_j$ and $y_{j+1}$ are provided, determined in accordance with the equation y=W×x, where W represents the weight values stored in the resistive memory elements of the 2×2 RPU array. The 2×2 RPU array represents a matrix of elements to store input values (e.g., 4 values in the 2×2 RPU array of FIG. 1). FIG. 2 depicts a circuit diagram 200 of the 2×2 RPU array illustrating a backward pass. In the backward pass, the voltages $\delta_j$ and $\delta_{j+1}$ are input, where $\delta_j$ and $\delta_{j+1}$ are learned from the neural network. The current to measure is $z_i$ and $z_{i+1}$ determined according to the equation $z=W^T \times \delta$. FIG. 3 depicts a circuit diagram 300 of the 2×2 RPU array illustrating a weight update. In the weight update, the weights are updated according to the equation $w_{ij} \leftarrow w_{ij} + \eta x_i \times \delta_j$.

The 2×2 RPU array shown in FIGS. 1-3 is an example of a two-dimensional crossbar array configured to perform forward vector-matrix multiplication, backward vector-matrix multiplication and weight updates. In some embodiments, an RPU array or crossbar array is formed from a set of conductive row wires and a set of conductive column wires that intersect the set of conductive row wires. The intersections between the set of row wires and the set of column wires are separated by RPUs, each having its own adjustable or updateable resistive weight. In forward vector-matrix multiplication, the conduction state (e.g., the stored weights) of an RPU can be read by applying a pulse-modulated voltage pulse across the RPU and measuring the current that passes through the RPU. Input voltages may be applied to the row wires in the forward pass, with each of the column wires summing the currents generated by each RPU along that column wire. For example, in the 2×2 RPU array of FIG. 1, the current $y=x_i \times W_{ij} + x_{i+1} \times W_{(i+1)j}$, where $W_{ij}$ is the weight value of RPU 101 and $W_{(i+1)j}$ is the weight value of RPU 103. Similarly, the current $y_{j+1} = x_i \times W_{i(j+1)} + x_{i+1} \times W_{(i+1)(k+1)}$, where $W_{i(j+1)}$ is the weight value of RPU 102 and $W_{(i+1)(j+1)}$ is the weight value of RPU 104. Thus, the RPU array computes the forward vector-matrix multiplication by multiplying the values stored in the RPUs by the row wire voltage pulse inputs, which are defined by voltages $x_i$ and $x_{i+1}$.

The backward vector-matrix multiplication is similar. In the backward vector-matrix multiplication, voltages are applied at the column wires and then read from the row wires. The row wires sum the currents generated by each RPU along that row wire. For example, in the 2×2 RPU array of FIG. 2, the current $z_j = \delta_j \times W_{ij} + \delta_{j+1} \times W_{i(j+1)}$ and the current $z_{i+1} = \delta_j \times W_{(i+1)j} + \delta_{j+1} \times W_{(i+1)(j+1)}$.

For weight updates, voltages are applied to the column wires and row wires at the same time, and the conductance values stored in the relevant RPU devices all update in parallel.

Embodiments described herein provide circuit-level and architecture-level solutions for solving the differential weight reading of analog resistive memory devices or memristors. To do so, some embodiments provide two field-effect transistors (FETs) in each crosspoint cell. Pulsed operation of these FETs, also referred to herein as current subtraction FETs, allows for subtracting a correct amount of current to provide accurate differential weight reading. By adding the current subtraction FETs and providing gate pulses synchronized with read voltage pulses, some embodiments can achieve the desired differential weight reading with minimal design overhead. By adjusting the gate voltage, the subtraction current value can be modified to accommodate different crosspoint device resistance ranges and to change the zero point. This can be useful for handling read noises in analog circuits. By implementing current subtraction in hardware rather than in the digital domain, some embodiments help to reduce the size of the current integrator circuit, which can be very large otherwise.

In a resistive memory or memristor based RPU device array, weight values may be stored in terms of conductance and/or resistance in each crosspoint device without sign information. To read out the weight values with positive and negative signs in reference to a zero value, some embodiments add reference current transistors and utilize a corresponding signaling scheme to achieve differential weight reading in a native RPU array.

Figure 4:
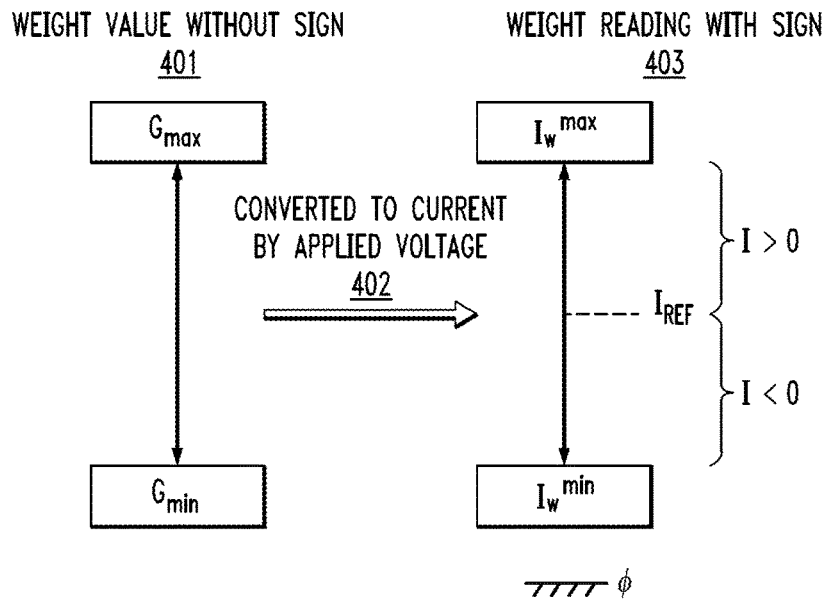
FIG. 4 depicts converting weight values measured with conductance to current by applying a voltage to obtain a weight reading with sign, according to an embodiment of the invention.

FIG. 4 depicts conversion 400 of weight values measured with conductance 401 (e.g., from $G_{min}$ to $G_{max}$) without sign information into net current by an applied voltage 402. The result is a weight reading with sign information 403, which ranges from current measurements between $I_w^{min}$ and $I_w^{max}$. Current above a threshold or reference current $I_{ref}$ is determined to be a positive weight reading (I>0) while current below the threshold or reference current $I_{ref}$ is determined to be a negative weight reading (I<0). Current at the threshold or reference current $I_{ref}$ represents a 0 weight value.

Figure 5:
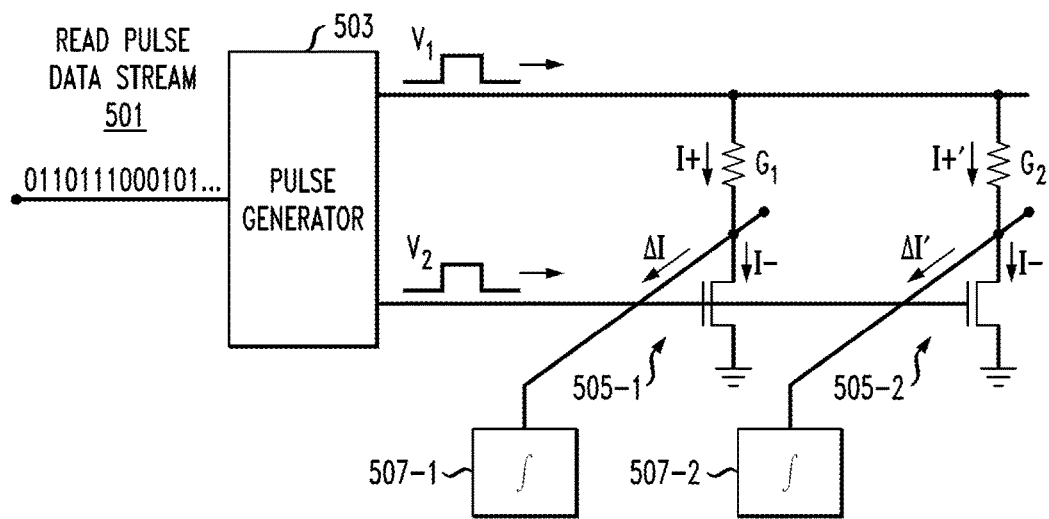
FIG. 5 depicts a pulse generator for signaling and reference current transistors to achieve differential weight reading in a resistive processing unit array, according to an embodiment of the invention.

FIG. 5 depicts an architecture 500 including a pulse generator 503, which receives a read pulse data stream 501 (e.g., a sequence of 0s and 1s such as 0110111000101 . . . ) as shown in FIG. 5. The pulse generator 503 is configured to generate first and second voltages denoted $V_1$ and $V_2$. The first voltage $V_1$ has a pulse with a fixed amplitude, but varying length. The second voltage $V_2$ is synchronized with $V_1$ by the pulse generator 503, and has another fixed amplitude (which may be different than the fixed amplitude of the pulse voltage $V_1$) along with a fixed pulse width to provide the appropriate adjustment to the measured current to achieve the differential weight reading. The first voltage $V_1$ is based on the read pulse data stream 501, with the second voltage $V_2$ being applied to the current subtraction FETs 505-1 and 505-2 for different resistive memory elements to provide current subtraction to convert the weight reading 401 without sign information into the weight reading 403 with sign information (e.g., net current) as described above.

The voltage $V_1$ is provided to the resistive memory elements with stored weight values $G_1$ and $G_2$. The current subtraction FETs 505-1 and 505-2 reduce the current I+ by I− to get the net current ΔI and ΔI' for the weight values $G_1$ and $G_2$. The net current, which includes sign information, is measured by the respective current integrators 507-1 and 507-2 (e.g., the net current with sign is accumulated through the line and integrated by the integrators 507-1 and 507-2).

By adding the current subtraction FETs 505-1 and 505-1 and providing gate pulses via voltage $V_2$ that are synchronized with read voltage pulses via voltage $V_1$, the differential weight reading is achieved with minimal design overhead. By adjusting the gate voltage via voltage $V_2$, the subtraction current value I− can be modified to accommodate different crosspoint device resistance range, and to change the zero point. This is useful for handling read noises in the analog circuit. Providing the current subtraction in hardware, rather than in the digital domain, helps to reduce the size of the current integrator circuits 507-1 and 507-2 and increase the resolution of the current integrator. Consider, as an example, an expected current I+ ranging from 10 microamperes (μA) to 90 μA and a desire to express 1000 weights given this range. If there are 9 devices in the column line and each device has 10 μA, 20 μA, 30 μA, . . . , 90 μA current, then 450 μA of total current will flow to the integrator. With I− of 50 μA, the current range becomes −40 μA to 40 μA. If the 9 devices in the same column have current values −40 μA, −30 μA, −20 μA, . . . , +20 μA, +30 μA, +40 μA, then the net current to the integrator becomes 0 μA.

Figure 6:
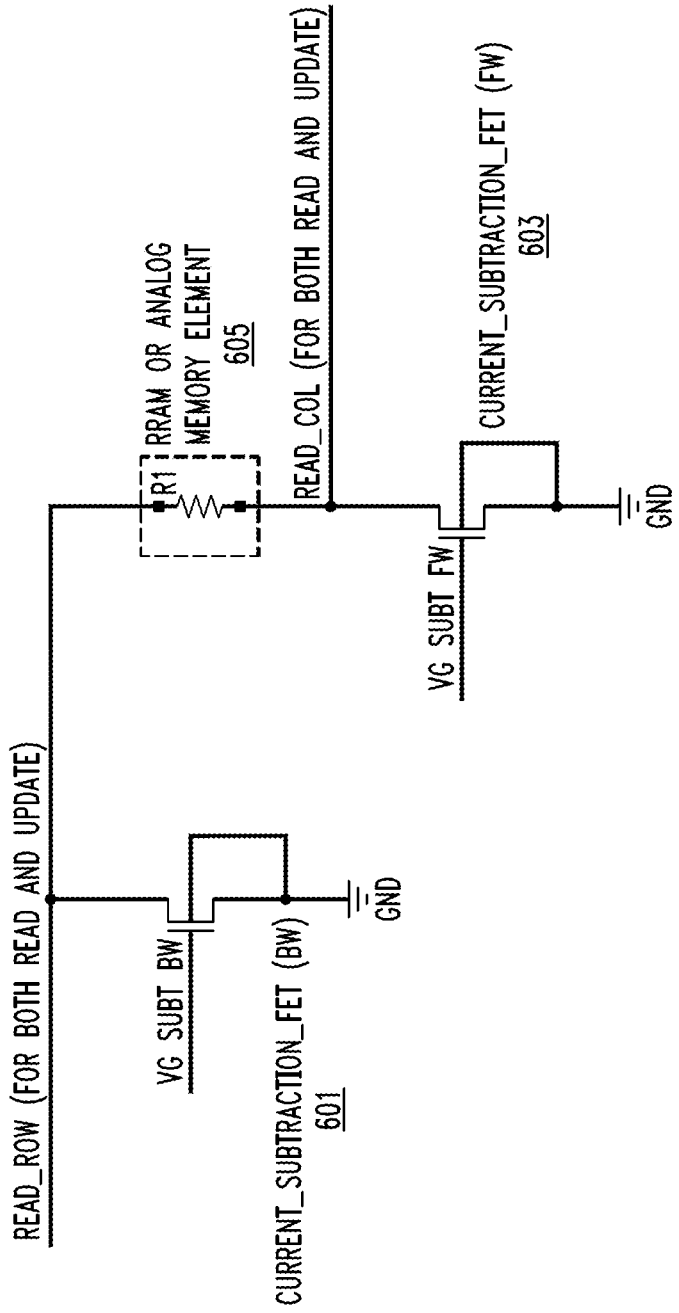
FIG. 6 depicts a circuit diagram of a resistive memory element having current subtraction transistors, according to an embodiment of the invention.

FIG. 6 shows a circuit diagram 600 of a resistive memory element 605 and current subtraction FETs 601 and 603. The current subtraction FETs 601 and 603 subtract current in the forward pass (FW) and backward pass (BW) modes, respectively. The read row read_row, used for both read and update, is used for the forward pass. The read column read_col, used for both read and update, is used for the backward pass. Pins for supply voltage (VDD) and ground (GND) are used. The gate pulse voltages for current subtraction are denoted VG_SUBST_FW and VG_SUBST_BW for the forward pass and backward pass current subtraction FETs 601 and 603, respectively.

The resistive memory element 605 may be a resistive random-access memory (RRAM) cell or other analog memory element such as a conductive-bridging random-access memory (CBRAM) device, a phase change memory (PCM) device, a ferroelectric memory device, a memristor device, a charge-trapping device, etc.

The current subtraction FET 601 for the backward pass reduces the current of the read_col when the net current is integrated by the integrator connected to the read_row (e.g., a current integrator 507-1, 507-2 as shown in FIG. 5). The current subtraction FET 603 for the forward pass reduces the current of the read_row when the net current is integrated by the integrator connected to the read_row (e.g., a current integrator 507-1, 507-2 as shown in FIG. 5).

Figure 7:
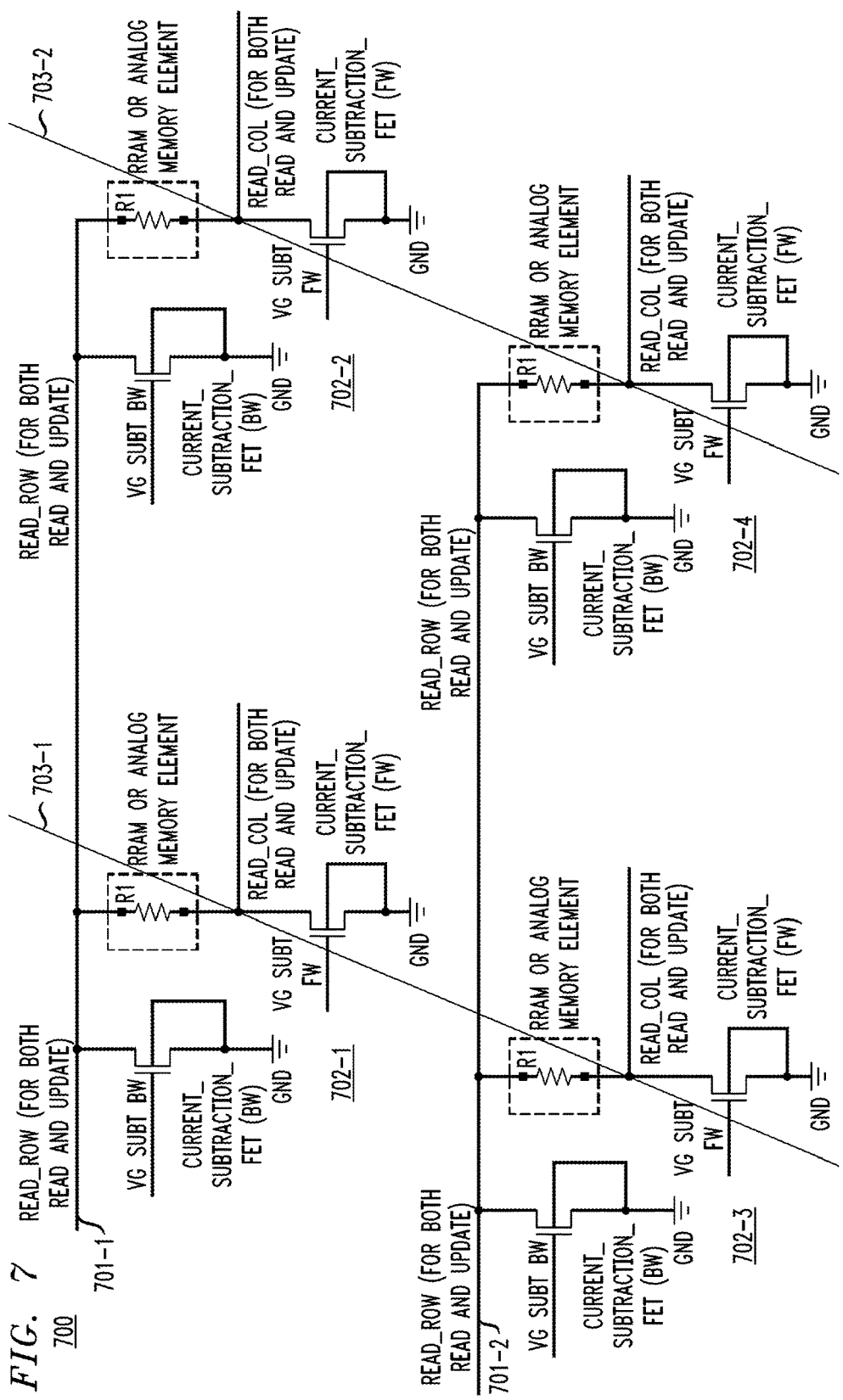
FIG. 7 depicts a circuit diagram of an array of resistive memory elements having current subtraction transistors, according to an embodiment of the invention.

FIG. 7 shows a circuit diagram 700 of a 2×2 array of resistive memory elements having current subtraction transistors. The resistive memory elements with current subtraction transistors are denoted 702-1, 702-2, 702-3 and 702-4 (collectively, 702). Each resistive memory element 702 is assumed to be configured in the manner described above with respect to FIG. 6. FIG. 7 shows first and second read rows 701-1 and 701-2 and first and second read columns 703-1 and 703-2.

Figure 8:
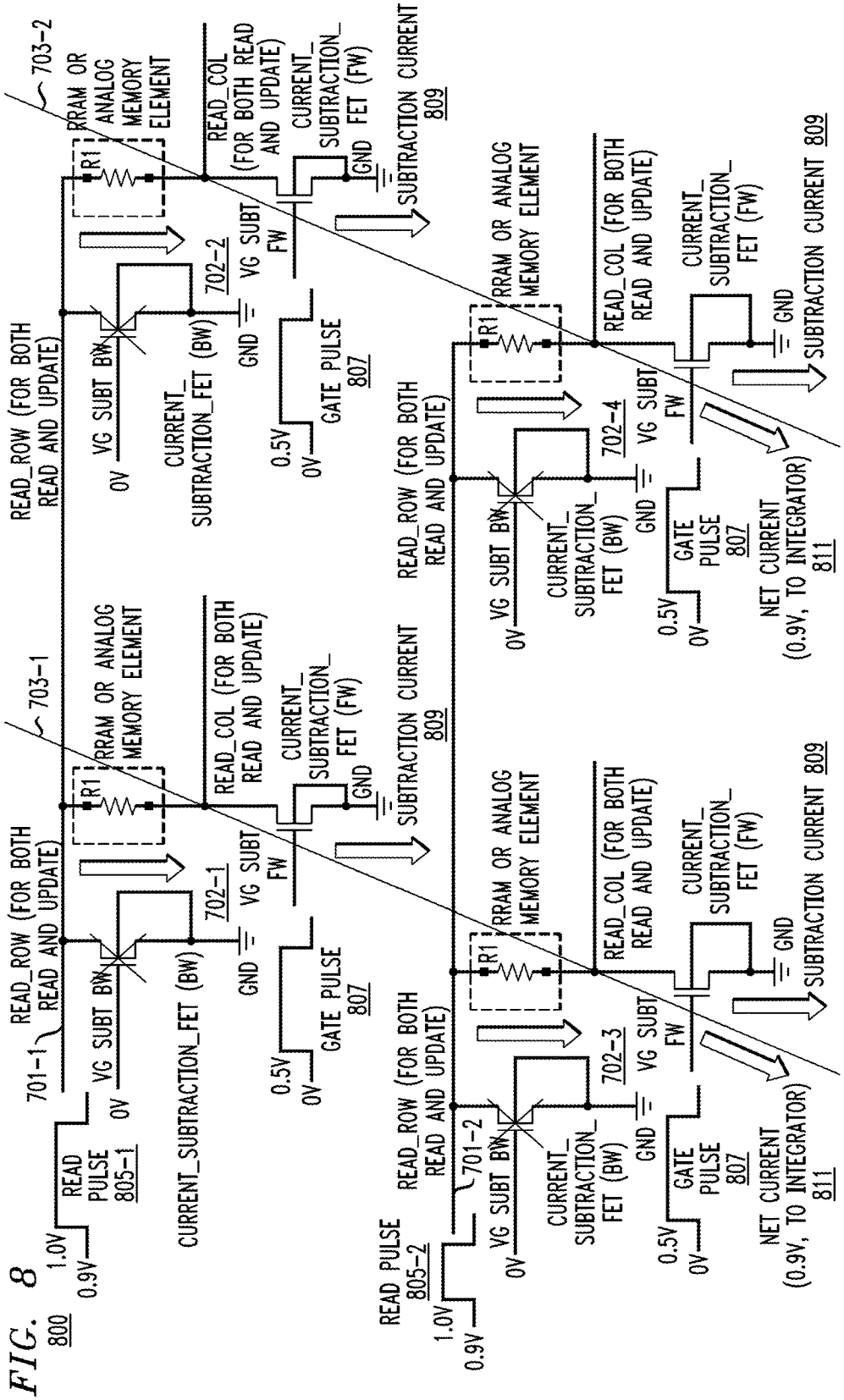
FIG. 8 depicts a circuit diagram of an array of resistive memory elements having current subtraction transistors performing a forward pass operation, according to an embodiment of the invention.

FIG. 8 depicts a circuit diagram 800, where the 2×2 array of resistive memory elements 702 perform a forward pass operation. The current subtraction FETs (both for forward pass and backward pass) turn on only when their respective gate pulse and read pulse data are high. FIG. 8 shows read pulses 805-1 and 805-2 on read rows 701-1 and 701-2, respectively. The read pulse voltages 805-1 and 805-2 have a same amplitude, but different pulse widths as illustrated in FIG. 8. The gate pulse voltage 807 has a same amplitude and pulse width for the forward pass current subtraction FET in each of the resistive memory elements 702. The gate pulse voltage for the backward pass current subtraction FET in each of the resistive memory elements 702 is 0 as illustrated. The current subtraction FETs of the resistive memory elements 702 provide subtraction current 809, and thus net current 811 to integrators as illustrated in FIG. 8.

FIG. 8, as described above, illustrates a forward pass operation. The backward pass operation is similar, though the gate pulse voltage applied to the backward pass current subtraction FETs in each resistive memory element 702 would be non-zero, while the gate pulse voltage applied to the forward pass current subtraction FETs in each resistive memory element 702 would be zero. Also, the read pulse voltages would be applied to the read columns 703-1 and 703-2 rather than to the read rows 701-1 and 701-2.

Figure 9:
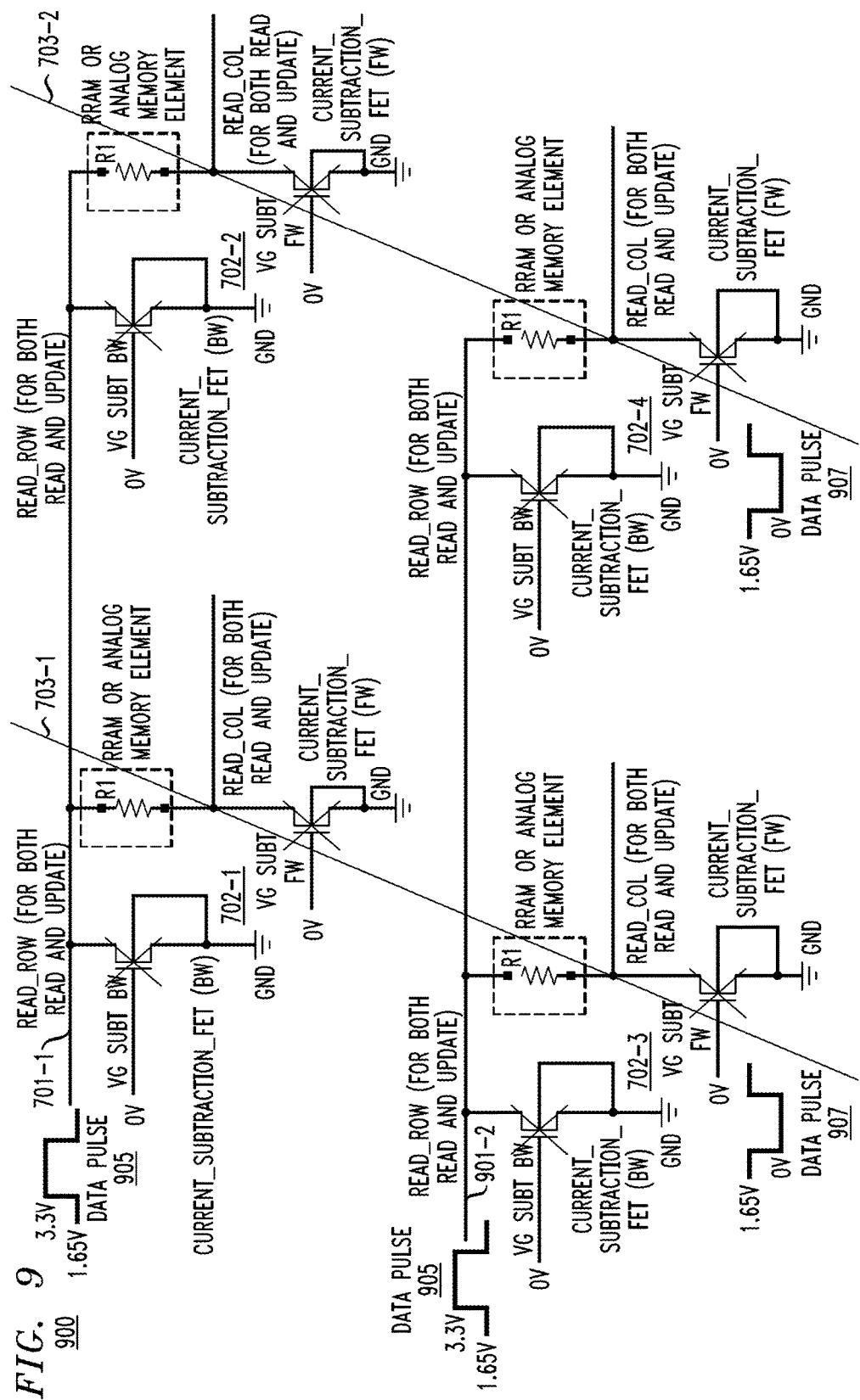
FIG. 9 depicts a circuit diagram of an array of resistive memory elements having current subtraction transistors performing a weight update, according to an embodiment of the invention.

FIG. 9 depicts a circuit diagram 900, where the 2×2 array of resistive memory elements 702 perform a weight update. During the weight update, the gate pulse voltages for both the forward and backward pass current subtraction FETs are zero, read pulses 905 are provided on the read rows 701-1 and 701-2, and read pulses 907 are provided on the read columns 703-1 and 703-2 so as to update weight values stored in each of the resistive memory elements 702.

In some embodiments, a resistive processing unit includes an analog memory element coupled to a read row line and a read column line, a first current subtraction FET coupled to the read row line and the analog memory element, and a second current subtraction FET coupled to the read column line and the analog memory element. The analog memory element is configured to store a weight value as its conductance. Application of a gate pulse voltage to one of the first current subtraction FET and the second current subtraction FET during application of a read pulse voltage to one of the read row line and the read column line reduces a measured conductance of the analog memory element, and the reduction of the measured conductance of the analog memory element provides net current for the stored weight value.

The analog memory element may be a RRAM cell.

The analog memory element may be further coupled to a current integrator configured to measure the net current passing through the analog memory element in response to the read pulse voltage applied to one of the read row line and the read column line.

The resistive processing unit may further comprise a pulse generator configured: to receive a read pulse data stream; to generate a first voltage based on the read pulse data stream, the first voltage having a read pulse width based on the read pulse data stream; to generate a second voltage, the second voltage having a gate pulse width synchronized with the read pulse width of the first voltage; to apply the first voltage to one of the read row line and the read column line; and to apply the second voltage to a gate of one of the first current subtraction FET and the second current subtraction FET. The gate pulse width of the second voltage may have a fixed duration and amplitude. During a forward pass operation, the pulse generator applies the first voltage to the read row line and the second voltage to the first current subtraction FET. During a backward pass operation, the pulse generator applied the first voltage to the read column line and the second voltage to the second current subtraction FET. During a weight update operation, the second voltage is zero.

In some embodiments, an integrated circuit comprises a pulse generator and an array of two or more resistive processing units. A given one of the resistive processing units comprises an analog memory element coupled to a read row line and a read column line, the analog memory element configured to store a weight value as its conductance, a first current subtraction FET coupled to the read row line and the analog memory element, and a second current subtraction FET coupled to the read column line and the analog memory element. The pulse generator is configured to receive a read pulse data stream, to generate a first voltage based on the read pulse data stream, the first voltage having a read pulse width based on the read pulse data stream, to generate a second voltage, the second voltage having a gate pulse width synchronized with the read pulse width of the first voltage, to apply the first voltage to one of the read row line and the read column line, and to apply the second voltage to a gate of one of the first current subtraction FET and the second current subtraction FET. The second voltage reduces a measured conductance of the analog memory element to provide net current for the stored weight value.

The gate pulse width of the second voltage may have a fixed duration and amplitude. During a forward pass operation, the pulse generator applies the first voltage to the read row line and the second voltage to the first current subtraction FET. During a backward pass operation, the pulse generator applied the first voltage to the read column line and the second voltage to the second current subtraction FET. During a weight update operation, the second voltage is zero. The analog memory element may comprise a RRAM cell.

In some embodiments, a method for differential weight reading of an analog memory element in a resistive processing unit comprises receiving a read pulse data stream, generating a first voltage based on the read pulse data stream, the first voltage having a read pulse width based on the read pulse data stream, generating a second voltage, the second voltage having a gate pulse width synchronized with the read pulse width of the first voltage, and applying the first voltage to one of a read row line and a read column line of the resistive processing unit. The method also includes applying the second voltage to a gate of one of: a first current subtraction FET coupled to the read row line and the analog memory element; and a second current subtraction FET coupled to the read column line and the analog memory element. The method further comprises measuring a conductance of the analog memory element, wherein the measured conductance is reduced by application of the second voltage to said one of the first current subtraction FET and the second current subtraction FET to provide net current for a stored weight value of the analog memory element.

The gate pulse width of the second voltage may have a fixed duration and amplitude. During a forward pass operation, the first voltage is applied to the read row line and the second voltage is applied to the first current subtraction FET. During a backward pass operation, the first voltage is applied to the read column line and the second voltage is applied to the second current subtraction FET. During a weight update operation, the second voltage is zero. The analog memory element may comprise a RRAM cell.

In the description above, various materials, dimensions and ranges of values for different elements are provided. Unless otherwise noted, such materials are given by way of example only and embodiments are not limited solely to the specific examples given. Similarly, unless otherwise noted, all dimensions and ranges are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive processing unit, comprising:
    an analog memory element coupled to a read row line and a read column line;
    a first current subtraction field-effect transistor (FET) coupled to the read row line and the analog memory element; and
    a second current subtraction FET coupled to the read column line and the analog memory element;
    wherein the analog memory element is configured to store a weight value as its conductance; and
    wherein application of a gate pulse voltage to one of the first current subtraction FET and the second current subtraction FET during application of a read pulse voltage to one of the read row line and the read column line reduces a measured conductance of the analog memory element; and
    wherein the reduction of the measured conductance of the analog memory element provides net current for the stored weight value.

2. The resistive processing unit of claim 1, wherein the analog memory element comprises a resistive random-access memory (RRAM) cell.

3. The resistive processing unit of claim 1, wherein the analog memory element is further coupled to a current integrator configured to measure the net current passing through the analog memory element in response to the read pulse voltage applied to one of the read row line and the read column line.

4. The resistive processing unit of claim 1, further comprising a pulse generator configured:
    to receive a read pulse data stream;
    to generate a first voltage based on the read pulse data stream, the first voltage having a read pulse width based on the read pulse data stream;
    to generate a second voltage, the second voltage having a gate pulse width synchronized with the read pulse width of the first voltage;
    to apply the first voltage to one of the read row line and the read column line; and
    to apply the second voltage to a gate of one of the first current subtraction FET and the second current subtraction FET.

5. The resistive processing unit of claim 4, wherein the gate pulse width of the second voltage has a fixed duration and amplitude.

6. The resistive processing unit of claim 4, wherein during a forward pass operation the pulse generator applies the first voltage to the read row line and the second voltage to the first current subtraction FET.

7. The resistive processing unit of claim 4, wherein during a backward pass operation the pulse generator applied the first voltage to the read column line and the second voltage to the second current subtraction FET.

8. The resistive processing unit of claim 4, wherein during a weight update operation the second voltage is zero.

9. An integrated circuit comprising:
    a pulse generator; and
    an array of two or more resistive processing units;
    wherein a given one of the resistive processing units comprises:
        an analog memory element coupled to a read row line and a read column line, the analog memory element configured to store a weight value as its conductance;
        a first current subtraction field-effect transistor (FET) coupled to the read row line and the analog memory element; and
        a second current subtraction FET coupled to the read column line and the analog memory element;
    wherein the pulse generator is configured:
        to receive a read pulse data stream;
        to generate a first voltage based on the read pulse data stream, the first voltage having a read pulse width based on the read pulse data stream;
        to generate a second voltage, the second voltage having a gate pulse width synchronized with the read pulse width of the first voltage;
        to apply the first voltage to one of the read row line and the read column line; and to apply the second voltage to a gate of one of the first current subtraction FET and the second current subtraction FET;

wherein the second voltage reduces a measured conductance of the analog memory element to provide net current for the stored weight value.

10. The integrated circuit of claim 9, wherein the gate pulse width of the second voltage has a fixed duration and amplitude.

11. The integrated circuit of claim 9, wherein during a forward pass operation the pulse generator applies the first voltage to the read row line and the second voltage to the first current subtraction FET.

12. The integrated circuit of claim 9, wherein during a backward pass operation the pulse generator applied the first voltage to the read column line and the second voltage to the second current subtraction FET.

13. The integrated circuit of claim 9, wherein during a weight update operation the second voltage is zero.

14. The integrated circuit of claim 9, wherein the analog memory element comprises a resistive random-access memory (RRAM) cell.

15. A method for differential weight reading of an analog memory element in a resistive processing unit, comprising:
receiving a read pulse data stream;
generating a first voltage based on the read pulse data stream, the first voltage having a read pulse width based on the read pulse data stream;
generating a second voltage, the second voltage having a gate pulse width synchronized with the read pulse width of the first voltage;
applying the first voltage to one of a read row line and a read column line of the resistive processing unit;
applying the second voltage to a gate of one of:
a first current subtraction field-effect transistor (FET) coupled to the read row line and the analog memory element; and
a second current subtraction FET coupled to the read column line and the analog memory element; and
measuring a conductance of the analog memory element, wherein the measured conductance is reduced by application of the second voltage to said one of the first current subtraction FET and the second current subtraction FET to provide net current for a stored weight value of the analog memory element.

16. The method of claim 15, wherein the gate pulse width of the second voltage has a fixed duration and amplitude.

17. The method of claim 15, wherein during a forward pass operation the first voltage is applied to the read row line and the second voltage is applied to the first current subtraction FET.

18. The method of claim 15, wherein during a backward pass operation the first voltage is applied to the read column line and the second voltage is applied to the second current subtraction FET.

19. The method of claim 15, wherein during a weight update operation the second voltage is zero.

20. The method of claim 15, wherein the analog memory element comprises a resistive random-access memory (RRAM) cell.

* * * * *